US011139128B2

(12) United States Patent
Maier

(10) Patent No.: US 11,139,128 B2
(45) Date of Patent: Oct. 5, 2021

(54) REMOTE CONTROL WITH STABILIZATION FILM DESIGNED AS CAPACITIVE SENSOR

(71) Applicant: FM MARKETING GMBH, Neumarkt am Wallersee (AT)

(72) Inventor: Ferdinand Maier, Neumarkt am Wallersee (AT)

(73) Assignee: FM MARKETING GMBH, Neumarkt am Wallersee (AT)

( * ) Notice: Subject to any disclaimer, the term of this patent is extended or adjusted under 35 U.S.C. 154(b) by 0 days.

(21) Appl. No.: 15/777,330

(22) PCT Filed: Nov. 21, 2016

(86) PCT No.: PCT/EP2016/078357
§ 371 (c)(1),
(2) Date: May 18, 2018

(87) PCT Pub. No.: WO2017/085328
PCT Pub. Date: May 26, 2017

(65) Prior Publication Data
US 2018/0350535 A1 Dec. 6, 2018

(30) Foreign Application Priority Data
Nov. 20, 2015 (DE) ..................... 10 2015 120 174.7

(51) Int. Cl.
*H01H 13/70* (2006.01)
*G06F 3/044* (2006.01)
(Continued)

(52) U.S. Cl.
CPC ......... *H01H 13/70* (2013.01); *G06F 3/03547* (2013.01); *G06F 3/044* (2013.01);
(Continued)

(58) Field of Classification Search
USPC .......................................... 345/169
See application file for complete search history.

(56) References Cited

U.S. PATENT DOCUMENTS 8,278,571 B2  10/2012  Orsley
9,831,051 B2  11/2017  Maier
(Continued)

OTHER PUBLICATIONS

International Search Report, PCT/EP2016/078357, dated Feb. 2, 2017, 2 pages.
Written Opinion, PCT/EP2016/078357, dated Feb. 2, 2017, 6 pages.

*Primary Examiner* — Amr A Awad
*Assistant Examiner* — Jonathan G Cooper
(74) *Attorney, Agent, or Firm* — Stinson LLP

(57) ABSTRACT

The invention relates to a remote control (1, 48) comprising: a first data read-in device (24, 78) and a second data read-in device (24, 78) which are each designed to read in data in a pressure direction (20, 61) on the basis of a pressure exerted by a user, a first pressure take-up element (30) assigned to the first data read-in device (24, 78) and a second pressure take-up element (30, 85) assigned to the second data read-in device (24, 78), which elements each have a pressure take-up side (35, 89) for taking up the pressure applied by the user, and a pressure output side for outputting the pressure, which was taken up, to the respective data read-in device (24, 78); and a flexible printed circuit board (31, 86, 97) which connects the pressure take-up sides (35, 89) of the pressure take-up elements (30, 85) to each other and on which at least one capacitive measurement transducer (38, 39, 93, 94) is formed whose capacitance is dependent on the position of a finger of the user on the flexible printed circuit board (31, 86, 97).

15 Claims, 8 Drawing Sheets

(51) Int. Cl.
*H03K 17/96* (2006.01)
*G06F 3/0354* (2013.01)

(52) U.S. Cl.
CPC ... *H03K 17/9622* (2013.01); *H01H 2215/004* (2013.01); *H01H 2225/002* (2013.01); *H01H 2229/028* (2013.01); *H01H 2231/032* (2013.01); *H01H 2239/006* (2013.01); *H03K 2017/9602* (2013.01)

(56) References Cited

U.S. PATENT DOCUMENTS

| | | |
|---|---|---|
| 2002/0049070 A1 | 4/2002 | Bick |
| 2005/0030048 A1 | 2/2005 | Bolender et al. |
| 2006/0202968 A1* | 9/2006 | Skillman ............... G06F 1/1626 345/168 |
| 2009/0014304 A1* | 1/2009 | Arai .................... H01H 13/704 200/341 |
| 2009/0079698 A1* | 3/2009 | Takashima ............ G06F 3/0224 345/169 |
| 2011/0205161 A1 | 8/2011 | Myers et al. |

\* cited by examiner

REMOTE CONTROL WITH STABILIZATION FILM DESIGNED AS CAPACITIVE SENSOR

REFERENCE TO RELATED APPLICATIONS

The present invention relates to a remote-control system. This application is a U.S. national stage application of International Patent Application No. PCT/EP2016/078357, filed Nov. 21, 2016, and claims the benefit of priority of German Application No. 10 2015 120 174.7, filed Nov. 20, 2015, the entire disclosures of which are incorporated herein by reference.

FIELD OF THE INVENTION

The present invention relates to a remote control.

BACKGROUND

A remote control is known, for example, from DE 10 2013 018 156 B3. It comprises a first data read-in device and a second data read-in device, which are each designed to read in data in a pressure direction on the basis of a pressure exerted by a user. The remote control also comprises a first pressure take-up element assigned to the first data read-in device and a second pressure take-up element assigned to the second data read-in device, which elements each have a pressure take-up side for taking up the pressure applied by the user, and a pressure output side for outputting the pressure, which was taken up, to the respective data read-in device. The two pressure take-up elements have a very large geometrical design as viewed in the pressure direction. Therefore, in order to stabilise their relative position to each other, they are connected together at their pressure take-up side via a flexible yet tension-resistant strip-like film, hereinafter denoted flexible film.

SUMMARY OF THE INVENTION

According to one aspect of the invention, a remote control comprises a first data read-in device and a second data read-in device which are each designed to read in data in a pressure direction on the basis of a pressure exerted by a user, a first pressure take-up element assigned to the first data read-in device and a second pressure take-up element assigned to the second data read-in device, which elements each have a pressure take-up side for taking up the pressure applied by the user, and a pressure output side for outputting the pressure, which was taken up, to the respective data read-in device, and a flexible printed circuit board which connects the pressure take-up sides of the pressure take-up elements to each other and on which at least one capacitive measurement transducer is formed whose capacitance is dependent on the position of a finger of the user relative to the flexible printed circuit board.

With the stated remote control it is proposed to design the flexible film described at the start as a flexible printed circuit board and to place a capacitive sensor there which can then be used as a redundant or additional input element on the remote control along with the existing pressure take-up elements. In this manner, the flexible printed circuit board acts not just as a mechanically stabilising element in order to stabilise the position of the pressure take-up elements in relation to one another, but also as a further input means for data recording. This expands the potential range of functions of the flexible film described at the start.

At the same time, designing the flexible film as a flexible printed circuit board with a capacitive sensor on the stated remote control provides two different sensor types for data input, which increase the reliability of the remote control.

In a further embodiment, the stated remote control comprises a first button element and a second button element which in each case are situated on a side of the flexible printed circuit board opposite the pressure take-up sides of the pressure elements. The two button elements can simply be touched, or pressed with a certain amount of force, by a user depending on the user type in order to input data. Depending on the force exerted, the input data is then recorded either by the data read-in devices and/or the capacitive sensor.

In a particular embodiment of the stated remote control, the button elements each have a pressure take-up side for taking up the pressure applied by the user, which lie in the same plane in a pressure-free state. The positioning of the pressure take-up side in a single plane allows users to make their inputs via the capacitive sensor by way of swiping movements. Therefore, if users are used to making similar inputs on their other electronic devices, such as a smartphone, they can use this input method intuitively. In contrast, if users are used to pressing firm buttons in order to input data, the remote control also makes this possible via pressing the pressure take-up elements.

In a further embodiment of the stated remote control, the two button elements each have an edge, which edges are arranged facing one another with a gap of less than 1 mm, preferably contacting one another. The gap should be as small as possible, on the one hand, so that it does not disrupt the user during the above-mentioned swiping movement. However, arranging the button elements such that they are directly adjacent can also lead to problems as the button elements may tilt towards one another when pressed.

To minimise the risk of tilting in spite of the button elements being arranged very close together, the button elements may be tapered at the respective edge along their thickness as viewed in the pressure direction. In this manner, the button elements can move such that one slides under the other upon pressing, thereby effectively preventing tilting.

In a further embodiment of the stated remote control, the flexible printed circuit board may be adhesively bonded with the pressure take-up elements and with the button elements. In this manner, both the flexible printed circuit board on the pressure take-up elements and the button elements on the flexible printed circuit board can be effectively held in place.

In another embodiment of the stated remote control, the flexible printed circuit board may be held in a form-fitting manner at least at one of the button elements as viewed at an angle to the pressure direction. In this way, the flexible printed circuit board as viewed in the pressure direction beneath the button elements can be prescribed a unique position with which any display elements on a side of the button elements opposite the flexible printed circuit board can also be correctly positioned.

In a further embodiment of the stated remote control, the flexible printed circuit board has a coating in the pressure direction below a transition between the two button elements. The coating makes it possible to conceal colour differences in the above-mentioned gap from the user. For example, if the flexible printed circuit board can only be embodied in a light colour such as orange due to the selection of a suitable material, and the above-mentioned gap is very large, this light colour will be visible through the gap. The coating in this location effectively prevents this from occurring.

In a particular embodiment, the stated remote control has a directional pad, wherein the two button elements are arranged around the circumference of the directional pad. Usually, users will hold the remote control with their fingers and operate the directional pad with their thumbs. Arranging the button elements around the circumference of the directional pad enables users to reach the button elements with ease in order to swipe them with their thumbs and thereby control associated functions.

In a particularly preferred embodiment of the stated remote control, the directional pad is also positioned on the flexible printed circuit board. In this manner, the above-mentioned combination of the mechanical pressure input of data and the capacitive input of data can be expanded to include the directional pad.

BRIEF DESCRIPTION OF THE DRAWINGS

The above-described properties, features and benefits of this invention and the manner in which they are achieved will be made clearer in connection with the following description of the exemplary embodiments, which are described in more detail in connection with the drawing. In the figures.

In the figures, the same technical elements are provided with the same reference signs and are only described once. The figures are purely schematic and, in particular, do not reflect the actual geometric proportions.

DETAILED DESCRIPTION OF PREFERRED EMBODIMENTS

Figure 1:
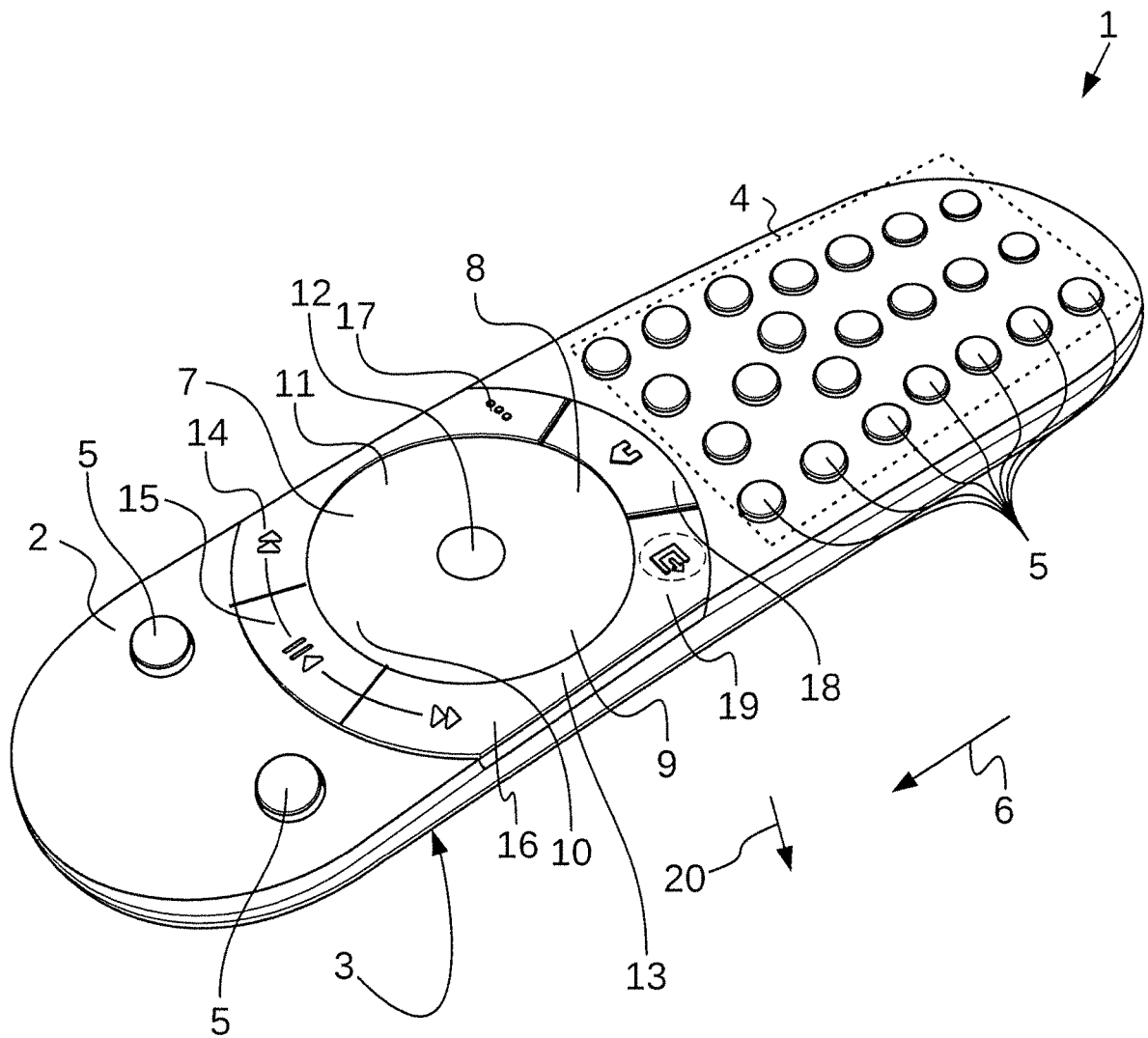
FIG. 1 shows a perspective view of a remote control according to a first exemplary embodiment.

Reference is made to FIG. 1, which shows a perspective view of a remote control 1 according to a first exemplary embodiment.

The remote control 1 comprises a housing, which is made up of an upper shell 2 and a lower shell 3, as well as a button field 4 with a plurality of button elements 5. For the sake of clarity, not all the button elements 5 in the button field 4 are given reference signs in the figures.

A directional pad 7 is arranged in a viewing direction 6 above the button field 4, which directional pad has a first button element 8, a second button element 9, a third button element 10 and a fourth button element 11. The four button elements 8 to 11 are provided for movement of a control element on an electronic device that is not shown in any more detail, which device may for example be embodied as a multimedia device, and the button elements are therefore arranged in the four possible directions of movement around the circumference of a confirmation button 12 at 90° intervals. The directional pad 7 with the four button elements 8 to 11 is embodied here in the form of a circular disc.

The directional pad 7 is entirely surrounded by a button ring 13. The button elements of the button ring 13 differ in their shape from the other button elements 5 on the remote control 1, as for example in button field 4. A first button element 14 of the button ring 13, a second button element 15 of the button ring 13, and a third button element 16 of the button ring 13 are arranged around the circumference of the directional pad 7 above this directional pad as viewed in the viewing direction 6, while a fourth button element 17 of the button ring 13, a fifth button element 18 of the button ring 13, and a sixth button element 19 of the button ring 13 are arranged around the circumference of the directional pad 7 below this directional pad as viewed in the viewing direction 6.

Finally, in the viewing direction 6 above the first to third button elements 14 to 16 of the button ring 13, two further button elements 5 are arranged which are embodied in the same manner as the button elements 5 in the button field 4.

The remote control 1 is to be used to control the operation of the electronic device which is not shown in any further detail, such as a set-top box. To this end, a user uses the buttons on the upper shell 2 of the remote control 1 to enter control commands into the remote control 1 in the form of data, which is then transmitted to the electronic device to be controlled via a transmitter not shown in any further detail.

In doing so, users normally hold the remote control 1 with the lower shell 3 in their fingers, while using their thumbs to operate the individual button elements on the upper shell 2 in order to input data. In order to input data, users can, on the one hand, press any of the button elements on the upper shell 2 in a pressure direction 20 into an interior space of the housing delimited by the upper shell 2 and the lower shell 3. On the other hand, users are also able to input data by touching the directional pad 7 or the button ring 13 without exerting any pressure, and by navigating back and forth with their thumbs on the corresponding button elements, which is referred to as swiping below.

Figure 2:
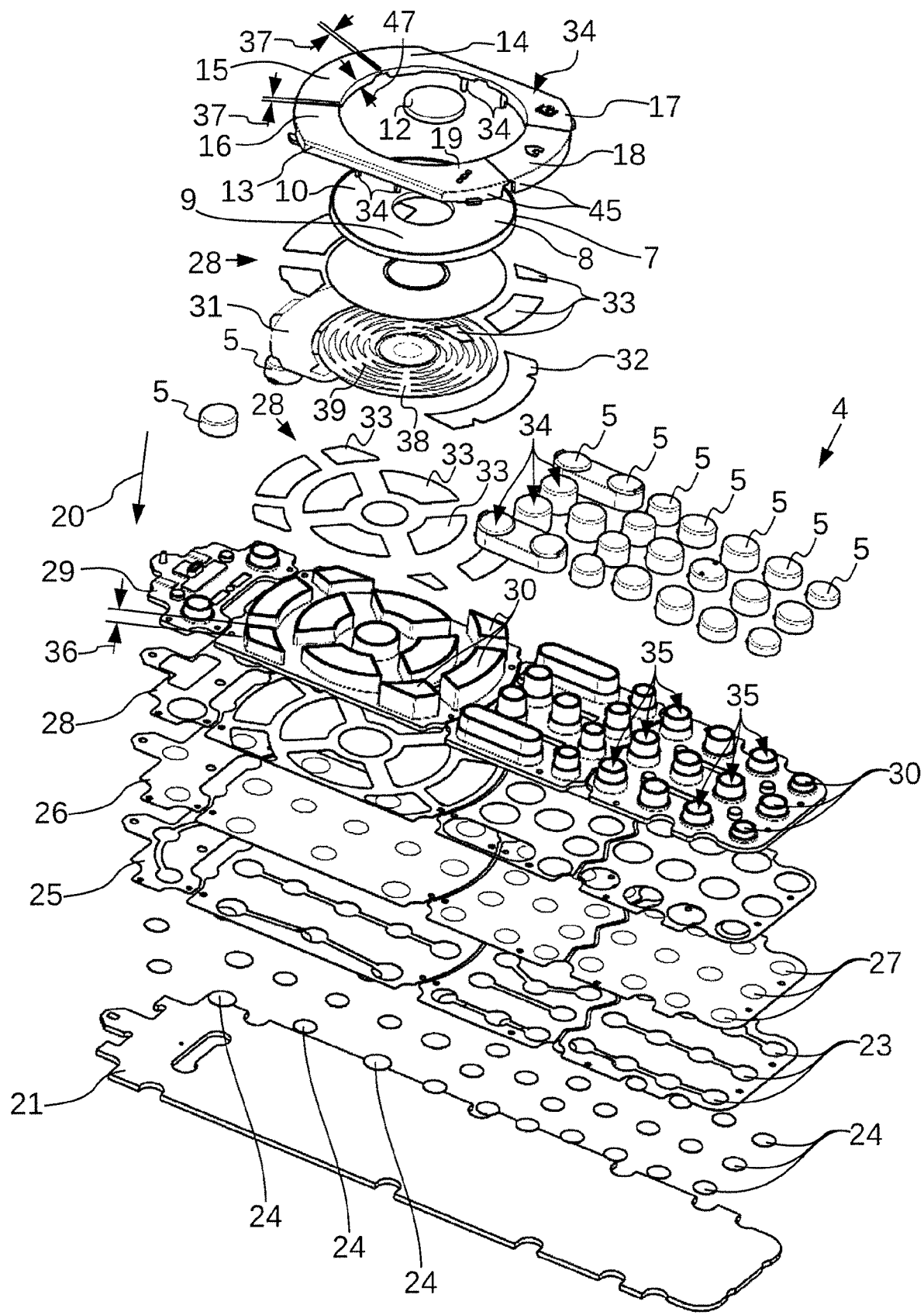
FIG. 2 shows a perspective exploded view of an inner part of the remote control from FIG. 1.

The input of data via pressure is explained in more detail below with the aid of FIG. 2, which shows an exploded view of the inner components of the remote control 1.

The remote control 1 comprises in its interior a printed circuit board 21, on which galvanically isolated switching contacts that are not depicted in any further detail are formed, which can be short-circuited by means of electrically conductive contact domes 24. For the sake of clarity, not all these contact domes 24 are given reference signs in FIG. 2.

The contact domes 24 are positioned on the printed circuit board 21 in a manner known per se with their edge region on a switching contact. When the button elements 5, 8 to 11 and 14 to 19 on the remote control 1 are pressed in the pressure direction 20, the contact domes 24 are then pressed down in their centres against a further switching contact on the printed circuit board 21. The switching contacts that are short-circuited in this manner now conduct an electrical current, which can then be evaluated in order to determine which of the button elements 5, 8 to 11 and 14 to 19 the user has pressed on the remote control 1. The switching contacts therefore serve, along with the contact domes 24, as data read-in devices with which the data input of the user can be read into an electric circuit on the printed circuit board 21.

In order to mechanically connect the contact domes 24 to the button elements 5, 8 to 12 and 14 to 19, a spacer film 25 with passage openings 23 is placed on the printed circuit board 21. For the sake of clarity, not all these passage openings 23 are given their own reference signs in FIG. 2. A retaining film 26 that holds the contact domes 24 in place is positioned on the spacer film 25. The holding points 27 on the retaining film 26 are marked with small circles, not all of which are given a reference sign in FIG. 2 for the sake of clarity. As viewed in the pressure direction 20, the holding points 27 are positioned precisely over the passage openings 23 in the spacer film 25. When the retaining film 26 is placed on the spacer film 25, the individual contact domes 24 are thus guided through the passage openings 23 and can be pressed down in order to short-circuit the switching contacts.

An adhesive film 28 is placed on the spacer film 25, by means of which a rubber mat 29 is held on the spacer film 25. A plurality of pressure take-up elements 30 are formed on this rubber mat 29, which on the one hand absorb a pressure exerted on the individual button elements 5, 8 to 12 and 14 to 19 in the pressure direction 20 and thus press down the contact domes 24 in the manner described above. On the other hand, the pressure take-up elements 30 reset the button elements 5, 8 to 12 and 14 to 19 to a starting position counter to the pressure direction 20 when the pressure on the button elements 5, 8 to 12 and 14 to 19 is removed. All button elements 5 outside the button ring 13 are held directly and in a form-fitting manner on the pressure take-up elements 30 on the rubber mat 29.

In contrast, the button elements 14 to 19 of the button ring 13 and the button elements 8 to 12 inside the button ring 13 are held on the pressure take-up elements 30 via a first flexible film 31 and a second flexible film 32. In order to enable the above-mentioned alternative input of data via swiping, the first flexible film 31 is embodied here as a flexible printed circuit board and is therefore referred to below as flexible printed circuit board 31. The technical details of the printed circuit board will be examined later on.

The flexible printed circuit board 31 and the second flexible film 32 are adhesively bonded onto the pressure take-up elements 30 via a further adhesive film 28 composed of a plurality of adhesive elements 33 that are not contiguous with one another. For the sake of clarity, not all these adhesive elements 33 are given their own reference signs in FIG. 2.

The button elements 14 to 19 of the button ring 13 and the button elements 8 to 12 inside the button ring 13 are adhesively bonded via a further adhesive film 28 with adhesive elements 33 on the side of the flexible printed circuit board 31 and of the second flexible film 32 that is opposite the pressure take-up elements 30, where once again, for the sake of clarity, not all the adhesive elements are given their own reference signs.

To input data via pressure, the user presses one of the button elements 5, 8 to 12 or 14 to 19 in the pressure direction 20, as viewed on the top side, hereinafter referred to as pressure take-up side 34 of the button elements, on the remote control 1 positioned in the user's fingers. For the sake of clarity, not all the pressure take-up sides 34 of the individual button elements 5, 8 to 12 and 14 to 19 are given reference signs in FIG. 2.

The component of the pressure exerted by the user on the pressure take-up sides 34 of the button elements 5, 8 to 12 and 14 to 19 which points in the pressure direction 20 is now transmitted to a pressure take-up side 35 of the pressure take-up element 30 assigned to the respective button element 5, 8 to 12 and 14 to 19. Through this component of the pressure, the above-mentioned corresponding contact dome 24 is pressed down and the switching contacts are short-circuited.

A second component of the pressure exerted by the user on the pressure take-up sides 34 of the button elements 5, 8 to 12 and 14 to 19, which points at right angles to the pressure direction 20, pushes the respectively pressed button element 5, 8 to 12 and 14 to 19 to the side and tilts the corresponding pressure take-up element 30. This can cause the button elements 5, 8 to 12 and 14 to 19 to tilt into the remote control 1. The likelihood of such tilting increases with the height 36 of the pressure take-up element 30. For the sake of clarity, not all these heights 36 are given their own reference signs in FIG. 2. However, the pressure take-up elements 30 and their heights 36 cannot be made arbitrarily small in remote controls for multimedia devices. On account of their grip properties, these types of remote controls must be designed such that they are somewhat rounded in their body, which requires a large distance between the lower shell 3 and the upper shell 2. The pressure take-up elements 30 between the printed circuit board 21 in the lower shell 3 and the button elements 5, 8 to 12 and 14 to 19 on the upper shell 2 must bridge this large distance.

The user is required to have a certain amount of skill to be able to press the buttons precisely in the pressure direction 20. For users with motor impairments for whom this level of skill cannot be expected, such as older users, suitable guides for the button elements 5, 8 to 12 and 14 to 19 can usually absorb these tilting forces and prevent tipping.

However, it may be necessary for design or technical reasons to arrange some of the button elements 5, 8 to 12 and 14 to 19 close together with a very small spacing, such that a suitable guide cannot be inserted. This is the case for the remote control shown in FIG. 1, with the button elements 14 to 19 of the button ring 13 and the button elements 8 to 12 inside the button ring 13. In order to further explain the exemplary embodiment, the button elements 14 to 19 of the button ring 13 are examined below. However, this should not be understood to be limiting, as the embodiments can be transferred to any button element in the remote control 1 which is to be positioned so close to another button element that a guide for avoiding tilting cannot be inserted, as for example the confirmation button 12.

The button elements 14 to 19 of the button ring 13 surround the circular directional pad 9 like a ring.

Here, the first button element 14 and the fourth button element 17 of the button ring 13, as well as the third button element 16 and the sixth button element 19 of the button ring 19, are embodied in each case as a single piece in the form of a rocker button. Every rocker button has supporting pins 34, into which the lower shell 3 can be pressed. If a button element 14, 16, 17, 19 of a rocker button is pressed in the pressure direction 20, the supporting feet 34 prevent the other button element 14, 16, 17, 19 on the rocker button from also being pressed down at the same time.

Between the rocker buttons and thus the button elements 14, 16, 17 and 19, the second and fifth button elements 15, 18 are positioned in the button ring 13 very close together with respective gaps 37 of less than 1 mm. For the sake of clarity, not all these gaps 37 are given reference signs in FIG. 2. Since the second and fifth button elements 15, 18 between the rocker buttons cannot or are not to be positioned with a guide owing to the small gaps 37, these two button elements 15, 18 can in principle tilt into the remote control if the user presses these button elements 15, 18 at an angle instead of precisely in the pressure direction 20.

Here, the films 31, 32 engage, absorb the pressure forces exerted by the user at an angle to the pressure direction 20, and thus ensure that pressure forces are only transmitted to the individual pressure take-up elements 30 in the pressure direction 20 when the second and fifth button elements 15, 18 are pressed. This effectively prevents tilting of the pressure take-up elements 30, regardless of their height 36.

However, should the pressure take-up elements 30 below the second and fifth button elements 15, 18 still tilt slightly despite the films 31, 32, an associated tipping with the rocker buttons in the button ring 13 can be avoided by way of a thickness 47 of the button elements 14 to 19 in the button ring 13 being tapered towards the individual gaps 37. Should the button elements 14 to 19 nonetheless tilt when pressed by the user, they can slide under the respective neighbouring button elements 14 to 19 in the button ring 13 without abutting against them.

In order to hold the films 31, 32 in a predetermined position on the underside of the button elements 14 to 19 of the button ring 13 as viewed in the pressure direction 20, walls 45 can be formed on at least some of the button elements 14 to 19, with which walls the films 31, 32 can be held in a form-fitting manner as viewed at an angle to the pressure direction 20. Not all these walls 45 can be seen in the view in FIG. 2.

In the present embodiment, the first film, and therefore the flexible printed circuit board 31, has a capacitive sensor in order to enable the alternative input of data via swiping, i.e. the flexible printed circuit board 31 has a plurality of capacitor plates 38, which are separated from one another by way of zigzag-shaped dielectric gaps 39. For the sake of clarity, not all these capacitor plates 38 and dielectric gaps 39 are given reference signs in FIG. 2.

The flexible printed circuit board 31 is described in further detail below with the aid of FIGS. 3 and 4, which respectively show a plan view and a view from below of the flexible printed circuit board 31.

The flexible printed circuit board 31 is divided into four regions. A first region bears the first to third button elements 14 to 16 of the button ring 13 and is therefore indicated with the reference sign of the button ring 13. A second region bears the directional pad 7 and is therefore indicated with the reference sign of the directional pad 7. A third region 12 bears the confirmation button 12 and is therefore indicated with the reference sign of the confirmation button 12. A fourth region is a ribbon cable 42, on which an electrical interface 43 is formed, in which electrical conductor paths 40 end. The individual regions 7, 12, 13, 42 are connected to one another by connecting elements 44.

Figure 3:
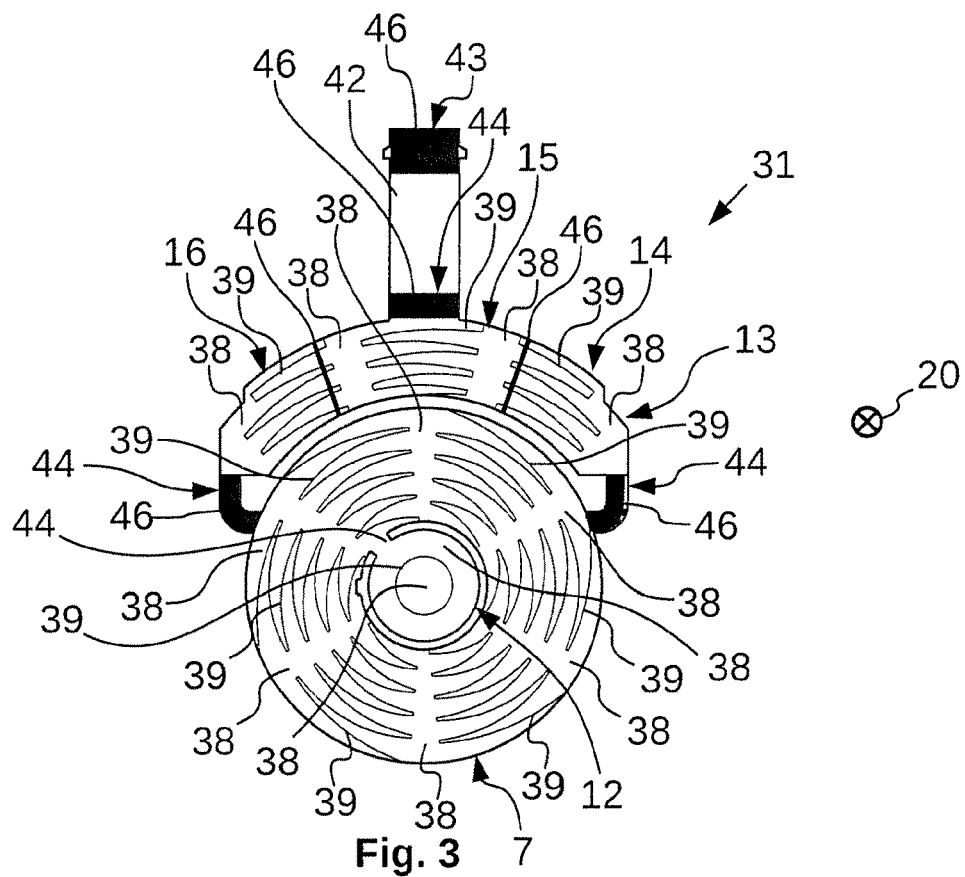
FIG. 3 shows a plan view of a flexible printed circuit board in the remote control from FIG. 2.
Figure 4:
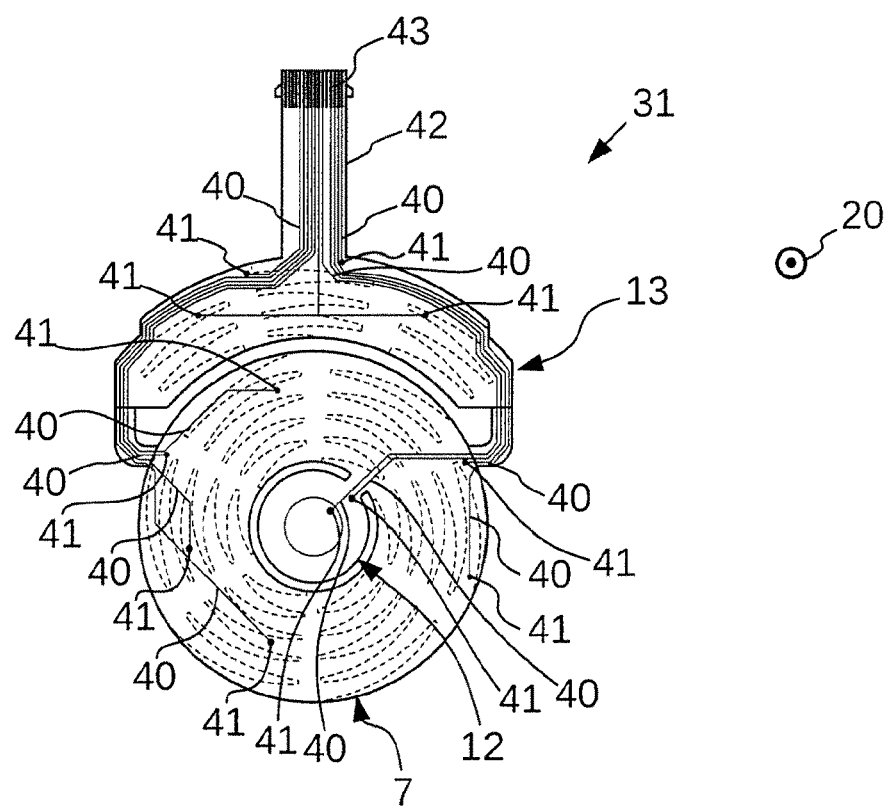
FIG. 4 shows a view from below of the flexible printed circuit board from FIG. 3.

The individual capacitor plates 38, which are separated from one another by way of the zigzag-shaped dielectric gaps 39, are formed in the regions of the button ring 13, the directional pad 7 and the confirmation button 12 on the top side of the flexible printed circuit board 31, which is shown in FIG. 3, as viewed in the pressure direction 20. The individual capacitor plates 38 have a certain capacitance in relation to one another in a manner known per se, which can be determined via through-holes 41 to the underside of the flexible printed circuit board 31 shown in FIG. 4, the electrical conductor paths and the electrical interface 43. For example, the interface 43 can be connected to the printed circuit board 21 in order to evaluate the capacitance of the capacitor plates 38 and further process it from an information technology standpoint. As the capacitance is also dependent on the length of the dielectric gaps 39 in a manner known per se, these gaps are made as long as possible by means of extension measures such as the zigzag shape shown.

If users move their thumbs over the pressure take-up surface 34 of the button ring 13, the directional pad 7 or the confirmation button 12, this certain capacitance between the capacitor plates 38 changes in a manner known per se, so that the position of the user's thumb can be determined. The technology relating to this is known, for example, from DE 10 2010 003 575 AI and will not be explained in any further detail.

Therefore, it is possible to input data on the remote control 1 not just via pressure but also via swiping across at least part of the button elements on the remote control 1. In this way, the remote control can be offered to a wider user base, for example users who are used to inputting data via raised buttons and those who are used to inputting data via finger swiping motions. The reliability is also improved by means of the remote control 1 of the present invention, as two data input systems are provided redundantly. Here, the redundant data input system simultaneously uses capacitive input technology to provide a stabilising function for the individual raised buttons in the remote control 1.

To enable users to move their thumbs over the pressure take-up surface 34 of the button ring 13 with as few obstacles as possible, the gaps 37 are made as small as possible in the above-described manner. Furthermore, the pressure take-up surfaces 34 of all button elements 14 to 19 of the button ring 13 lie in the same plane in a pressure-free state.

In addition, coatings 46 may be present between the individual button elements on the top side of the flexible printed circuit board 31 in the region of the gaps 37. The coatings 46 are designed in a colour such as black, which cannot be seen through the gap 37. However, if a connecting element 44 is small enough to not be noticed by the user, the coating may be dispensed with. This is the case, for example, for the connecting element 44 between the directional pad 7 and the confirmation button 12.

Figure 5:
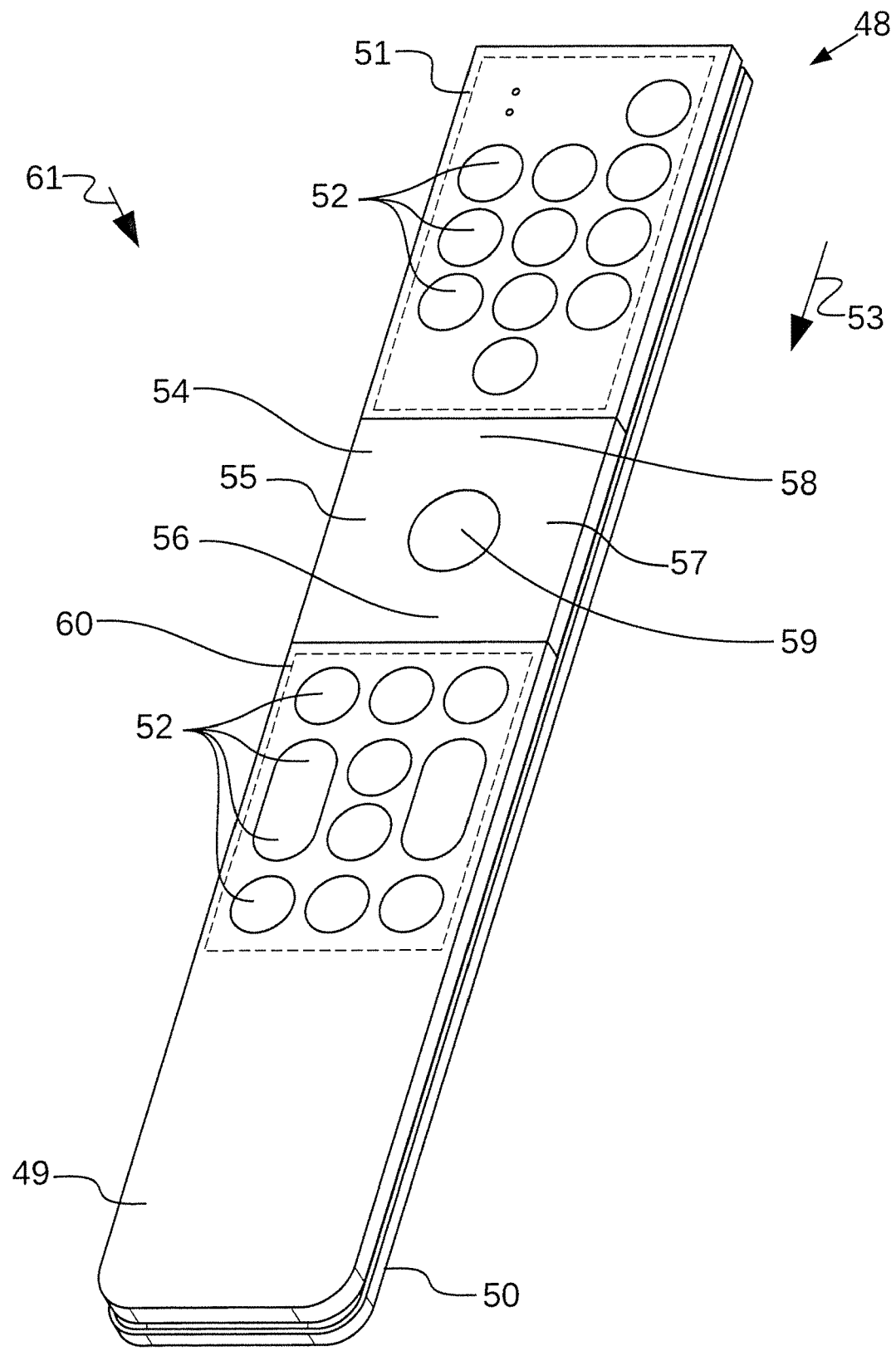
FIG. 5 shows a perspective view of a remote control according to a second exemplary embodiment.

Reference is made to FIG. 5, which shows a perspective view of a remote control 48 according to a second exemplary embodiment.

The remote control 48 comprises a housing, which is made up of an upper shell 49 and a lower shell 50. A button field 51 with a plurality of button elements 52 is arranged on the remote control 48. For the sake of clarity, not all the button elements 52 of the first button field 51 are given reference signs in the figures. A directional pad 54 is arranged below the first button field 51 as viewed in a viewing direction 53, which directional pad is embodied in the form of a square. The regions at the edges of the directional pad 54 correspondingly form a first button element 55, a second button element 56, a third button element 57 and a fourth button element 58. The four button elements 55 to 58 are provided for movement of a control element on the previously mentioned electronic device that is not shown in any more detail. The four button elements 55 to 58 are therefore arranged in the four possible directions of movement around the circumference of a circular confirmation button 59 at 90° intervals. Finally, a second button field 6 is arranged below the directional pad 54 in the viewing direction 53, which button field is embodied fundamentally in the same manner as the first button field 51. In contrast to the first button field 51, some of the button elements 52 in the second button field 60 are connected to one another. Furthermore, the button elements 52 in the second button field 60 are arranged slightly differently to those in the first button field 51.

The button elements 52 can be pressed into the remote control 48 in a pressure direction 61 at right angles to the viewing direction 53.

The remote control 48 will be explained in more detail below with the aid of FIG. 6.

Figure 6:
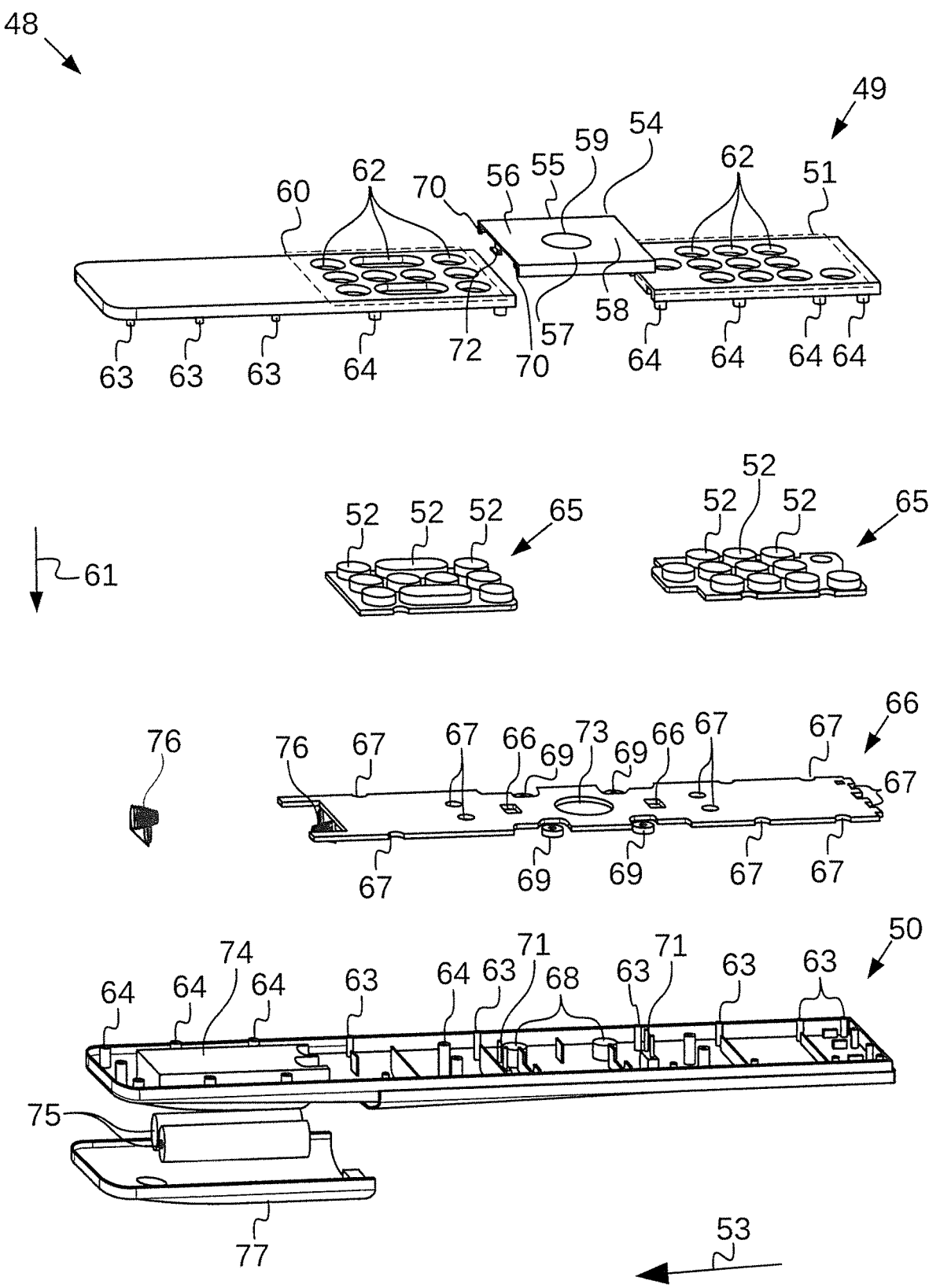
FIG. 6 shows a perspective exploded view of an inner part of the remote control from FIG. 5.

As can be seen in FIG. 6, the upper shell 49 is made up of multiple parts. Button guide openings 62 pass through the upper shell 49 in the pressure direction 61, into which the button elements 52 of the button fields 51, 60 are guided. For the sake of clarity, not all these button guide openings 62 are given their own reference signs.

A plurality of pins 63 and sleeves 64 are arranged in the pressure direction 61 on the underside of the upper shell 49 and on the top side of the lower shell 50, where for the sake of clarity not all these pins and sleeves are given their own reference signs. For every pin 63 on the upper shell 49 or the lower shell 50, a corresponding sleeve 64 is arranged in fundamentally the same location on the other side, in other words on the lower shell 50 or on the upper shell 60, so that when the upper shell 49 is placed on the lower shell 50, a pin 63 can be guided into every sleeve 64. Here, the pins 63 are held in the sleeves 54 in a form-fitting manner, so that the upper shell 49 can be held together by the plurality of form-fitting connections alone, without further means of connection such as screws, adhesives, hooks or the like. This hold can be further reinforced by slightly offsetting the pins 63 and sleeves 64 in relation to one another, as this tensions the pins 63 and sleeves 64 against each other.

The button elements 52 are positioned on button supports 65 such that a button element 52 can be inserted into every button guide opening 62. Every button field 51, 60 is assigned its own button support 65. The button support 65 will be described in more detail later on the basis of the button support 65 for the first button field in connection with FIG. 7.

A printed circuit board 66 is arranged on an underside of the button supports 65 as viewed in the pressure direction 61. Pin guides 67 in the form of passage openings or notches pass through this printed circuit board 66, in which pins 64 of the above-described pin/sleeve connection are received. For the sake of clarity, not all these pin guides 67 are given their own reference signs. The printed circuit board 66 is held at the pins 64 in a plane perpendicular to the pressure direction 61 in a form-fitting manner between the upper shell 49 and the lower shell 50 by way of the pin guides 67.

An electric circuit, which is not shown in any further detail, is present on the printed circuit board 66, with which circuit data relating to an actuation of the buttons 52 or the directional pad 54 is recorded electrically and sent to the above-mentioned electronic device in order to control the latter. The sending of data is not explained in any further detail below.

An actuation of the directional pad 54 is recorded magnetically in the present embodiment. In order to achieve this, four bearing shells 68 are arranged on the top side of the lower shell 50, with an armature magnet 69 being inserted into each bearing shell. Not all the bearing shells 68 on the lower shell 50 are shown in the perspective view in FIG. 6. On an underside of the directional pad 54 as viewed in the pressure direction 61, four bearing shells and sensing magnets arranged therein, which cannot be seen, are arranged such that they correspond to the bearing shells 68 on the lower shell 50 and the armature magnets 69 and such that, in a state where the upper shell 49 is positioned on the lower shell 50, one sensing magnet in each case lies on an armature magnet 69 with their opposite poles facing, and the directional pad 54 is magnetically pushed away by the lower shell 50. In order to restrict the movement of the directional pad 54 owing to this magnetic force, delimiting lugs 70 are formed accordingly on the directional pad 54. For the purpose of actuation, the directional pad 54 can thus be pushed counter to the magnetic force in the pressure direction 61 onto the individual button elements 55 to 58. If the pressure force is triggered, the magnetic force returns the directional pad 54 to a starting position. Two guide rails 71 are arranged for the purpose of guiding the pressure movement, with a guide lug 72 being formed in each guide rail, of which only one can be seen in the perspective view in FIG. 6. The directional pad 54 itself is guided here into a directional pad guide opening 73 via a guide element, which is arranged on the underside of the directional pad 54 as viewed in the pressure direction 61 and cannot be seen in the perspective view of FIG. 6. Magnetic field sensors, which cannot be seen, are arranged on the printed circuit board 66 in order to evaluate an actuation of the directional pad 54. These sensors record a change in the magnetic field, which is triggered by the sensing magnets on the underside of the directional pad 54 as a result of the movement, and thus enable corresponding actuation data to be sent to the above-mentioned electronic device.

Two batteries 75 are positioned in a battery compartment 74 on the lower shell 50 in order to supply energy to the printed circuit board 66 and thus the remote control 48. Additional spring contact elements 76 are positioned in the battery compartment 74 for mechanical fixing of the batteries, which elements are metallic and therefore close an electrical circuit between the printed circuit board 66 and the batteries 75. The battery compartment 74 is closed with a lid 77 on the underside of the lower shell 50 as viewed in the pressure direction 51.

Figure 7:
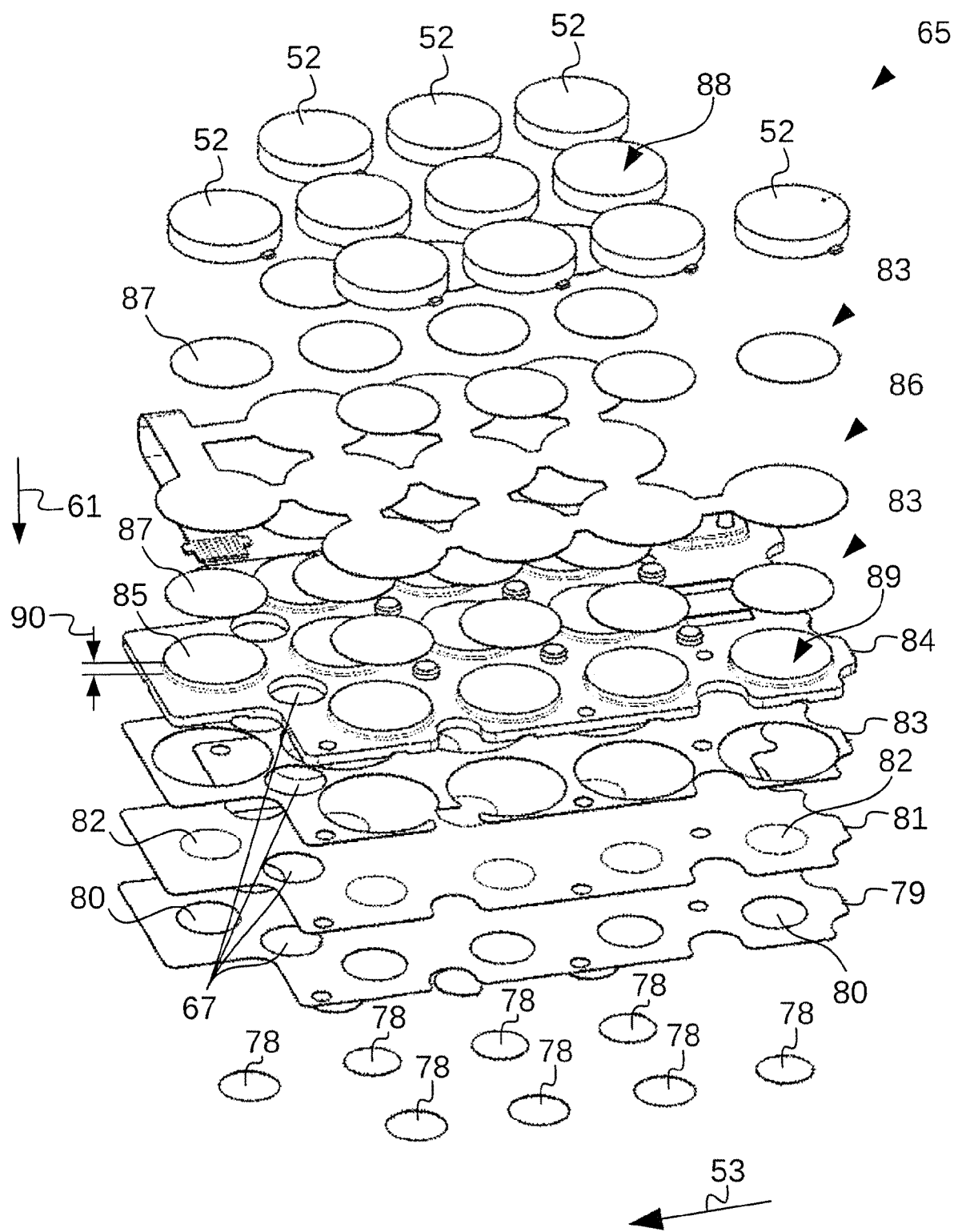
FIG. 7 shows a perspective exploded view of an inner part of the button field 51 from FIG. 6.

The recording of the pressure actuation of the button elements 52 of the two button fields 51, 60 will be explained below by way of the first button field 51. Reference is made here to FIG. 7, which shows a perspective exploded view of the button support 65 that belongs to the first button field 51. The button support 65 for the second button field 60 is designed analogously and, for the sake of brevity, will not be explained in addition below.

In a similar manner to the printed circuit board 21 of the remote control 2 in the first exemplary embodiment, galvanically isolated switching contacts that are not depicted in any further detail are formed on the printed circuit board 66 of the remote control 48 in the second exemplary embodiment, which contacts can be short-circuited by means of electrically conductive contact domes 78. For the sake of clarity, not all these contact domes 78 are given reference signs in FIG. 7.

The contact domes 78 are positioned on the printed circuit board 66 in a manner known per se with their edge region on a switching contact. When the button elements 52 on the remote control 48 are pressed in the pressure direction 61, the contact domes 24 are then pressed down in their centres against a further switching contact on the printed circuit board 66. The switching contacts that are short-circuited in this manner now conduct an electrical current, which can then be evaluated in order to determine which of the button elements 52 the user has pressed on the remote control 48. The switching contacts therefore serve, along with the contact domes 78, as data read-in devices with which the data input of the user can be read into the electric circuit on the printed circuit board 66.

In order to mechanically connect the contact domes 78 to the button elements 52, a spacer film 79 with passage openings 80 is placed on the printed circuit board 66. For the sake of clarity, not all these passage openings 80 are given their own reference signs in FIG. 7. These passage openings 80 for the contact domes 78 are to be considered as conceptually separate from the above-mentioned pin guides 67. A retaining film 81 that holds the contact domes 78 in place is positioned on the spacer film 79. The holding points 82 on the retaining film 81 are marked with small circles, not all of which are given a reference sign in FIG. 7 for the sake of clarity. As viewed in the pressure direction 61, the holding points 82 are positioned precisely over the passage openings 80 in the spacer film 79. When the retaining film 81 is placed on the spacer film 79, the individual contact domes 78 are thus guided through the passage openings 80 and can be pressed down in order to short-circuit the switching contacts.

An adhesive film 83 is placed on the spacer film 79, by means of which a rubber mat 84 is held on the spacer film 79. A plurality of pressure take-up elements 85 are formed on this rubber mat 84, which on the one hand absorb a pressure exerted on the individual button elements 52 in the pressure direction 61 and thus press down the contact domes 78 in the manner described above. On the other hand, the pressure take-up elements 85 reset the button elements 52 to a starting position counter to the pressure direction 61 when the pressure on the button elements 52 is removed.

The button elements 52 are held on the pressure take-up elements 85 by way of a flexible film 86. The flexible film 86 is embodied here as a flexible printed circuit board and is therefore referred to below as flexible printed circuit board 86. The technical details of the printed circuit board 86 will be examined later on. The flexible printed circuit board 86 is adhesively bonded onto the pressure take-up elements 30 via a further adhesive film 83 composed of a plurality of adhesive elements 87 that are not contiguous with one another. For the sake of clarity, not all these adhesive elements 33 are given their own reference signs in FIG. 7.

The button elements 52 are adhesively bonded via a further adhesive film 83 with adhesive elements 87 on the side of the flexible printed circuit board 86 that is opposite the pressure take-up elements 85, where once again, for the sake of clarity, not all the adhesive elements are given their own reference signs.

To input data via pressure, the user presses one of the button elements 52 in the pressure direction 61, as viewed on the top side, hereinafter referred to as pressure take-up side 88 of the button elements, on the remote control 48 positioned in the user's fingers. For the sake of clarity, not all the pressure take-up sides 34 of the individual button elements 52 are given reference signs in FIG. 7.

The component of the pressure exerted by the user on the pressure take-up sides 34 of the button elements 52 which points in the pressure direction 61 is now transmitted to a pressure take-up side 89 of the pressure take-up element 85 assigned to the respective button element 52. Through this component of the pressure, the above-mentioned corresponding contact dome 78 is pressed down and the switching contacts are short-circuited.

A second component of the pressure exerted by the user on the pressure take-up sides 88 of the button elements 52, which points at right angles to the pressure direction 61, for example in the viewing direction 53, tips the respectively pressed button element 52 into the corresponding button guide opening 62. This can cause the button elements 52 to tilt into the corresponding button guide opening 62. The likelihood of such tilting increases as the height 90 of the pressure take-up element 85 decreases. For the sake of clarity, not all these heights 90 are given their own reference signs in FIG. 7. However, as explained above, the pressure take-up elements 85 and their heights 90 cannot be made arbitrarily small in remote controls for multimedia devices.

Here, the flexible printed circuit board 86 engages, absorbs the pressure forces exerted by the user at an angle to the pressure direction 61, and thus ensures that pressure forces are only transmitted to the individual pressure take-up elements 85 in the pressure direction 61 when the button elements 52 are pressed. This effectively prevents tilting of the pressure take-up elements 85, regardless of their height 90.

Figure 8:
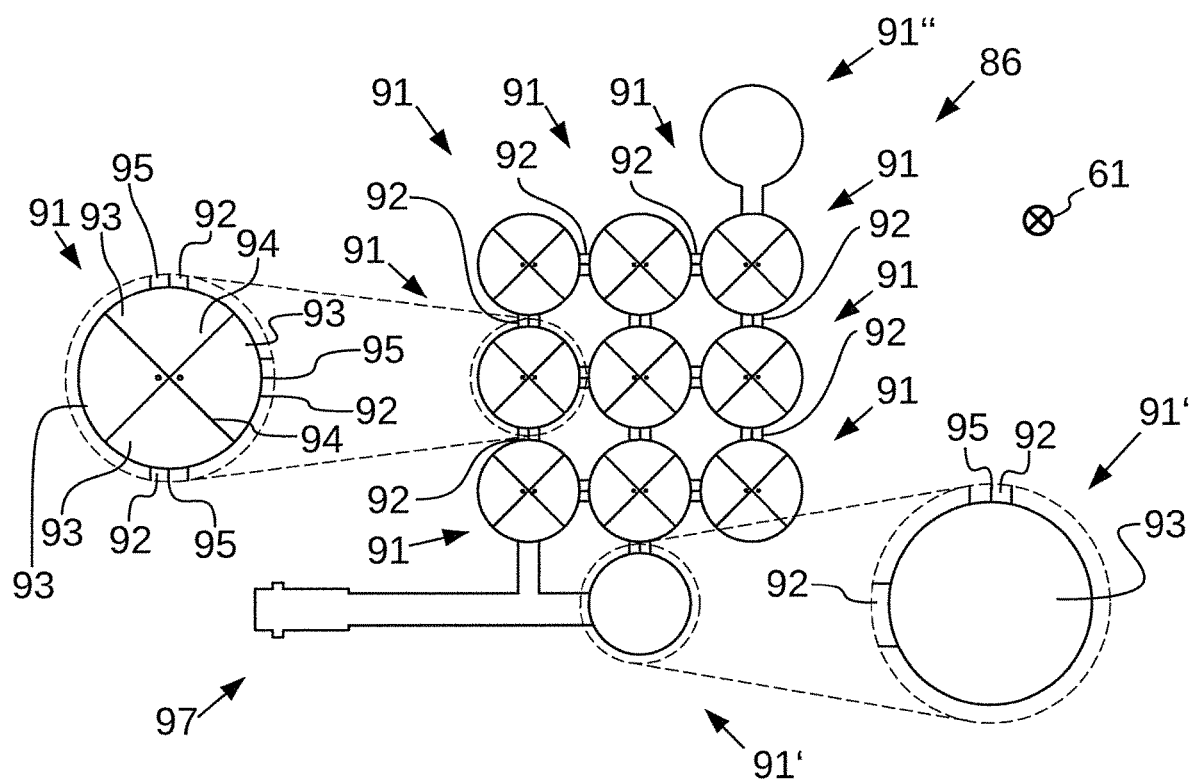
FIG. 8 shows a plan view of a flexible printed circuit board in the remote control from FIG. 5

The flexible printed circuit board 31 is described in further detail below with the aid of FIGS. 8 and 9, which respectively show a plan view and a view from below of the flexible printed circuit board 31.

In the present embodiment, the flexible printed circuit board 86 has, for every button 52 of the first button field 51, head-shaped button regions 91, 91', 91", which are connected to one another via connecting bridges 92 to form a grid that corresponds to the first button field 51. For the sake of clarity, the head-shaped button regions 91, 91', 91" are divided into three different types below, which will be described in more detail later on. The buttons 52 are positioned on the head-shaped button regions 91, 91', 91", while the connecting bridges 92 provide for the above-described mechanical stability in order to prevent tipping. For the sake of clarity, not all the button regions 91 and connecting bridges 92 are given reference signs.

Capacitive sensors are formed on button regions 91 of the first type and button regions 91' of the second type, in order to enable alternative data input via touching the buttons. One of each of these button regions 91, 91' is shown enlarged by way of example in FIG. 8.

The button regions 91 of the first type each comprise a plurality of segment-shaped capacitor plates 93, which are separated from one another by dielectric gaps 94. In contrast, the button regions 91' of the second type have only a single capacitor plate 93. The individual capacitance plates 93 are connected to one another via electrical lines 95, which are guided over the connecting bridges 92. In this manner, a circuit network of flat capacitors is formed, whose capacitance values can be changed by users placing their fingers on one of the buttons 51.

Figure 9:
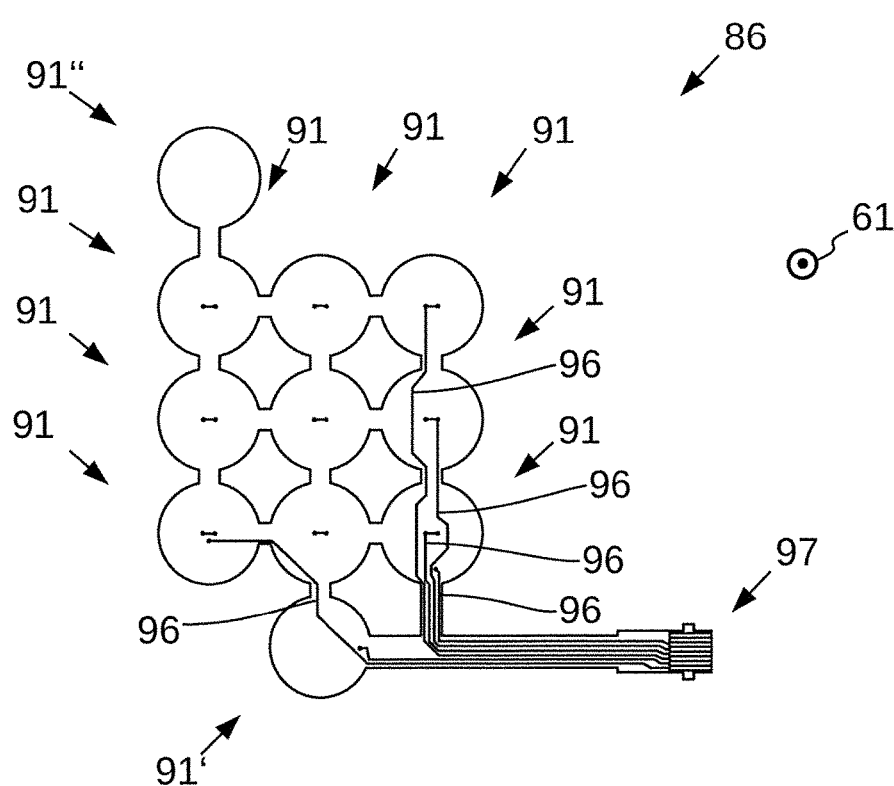
FIG. 9 shows a bottom plan view of a flexible printed circuit board in the remote control from FIG. 5.

To evaluate these capacitance values of the capacitor network, on an underside, as seen in the pressure direction 61, of the flexible printed circuit board 86 shown in FIG. 9, evaluation lines 96 from some of the capacitor plates 93 are connected through the flexible printed circuit board 86 to an electrical interface 97. A capacitance evaluation device can be connected to this electrical interface 97 in a manner known per se, and the position of the user's finger on one of the buttons 52 of the first button field 51 can be recorded in a dedicated manner.

Therefore, it is possible to input data on the remote control 48 not just via pressure but also by touching at least part of the buttons 52 on the remote control 48. In this way, the remote control can be offered to a wider user base, for example users who are used to inputting data via raised buttons and those who are used to inputting data via finger touches. The reliability is also improved by means of the remote control 48 of the present invention, as two data input systems are provided redundantly. Here, the redundant data input system simultaneously uses capacitive input technology to provide a stabilising function for the individual raised buttons in the remote control 48.

Figure 10:
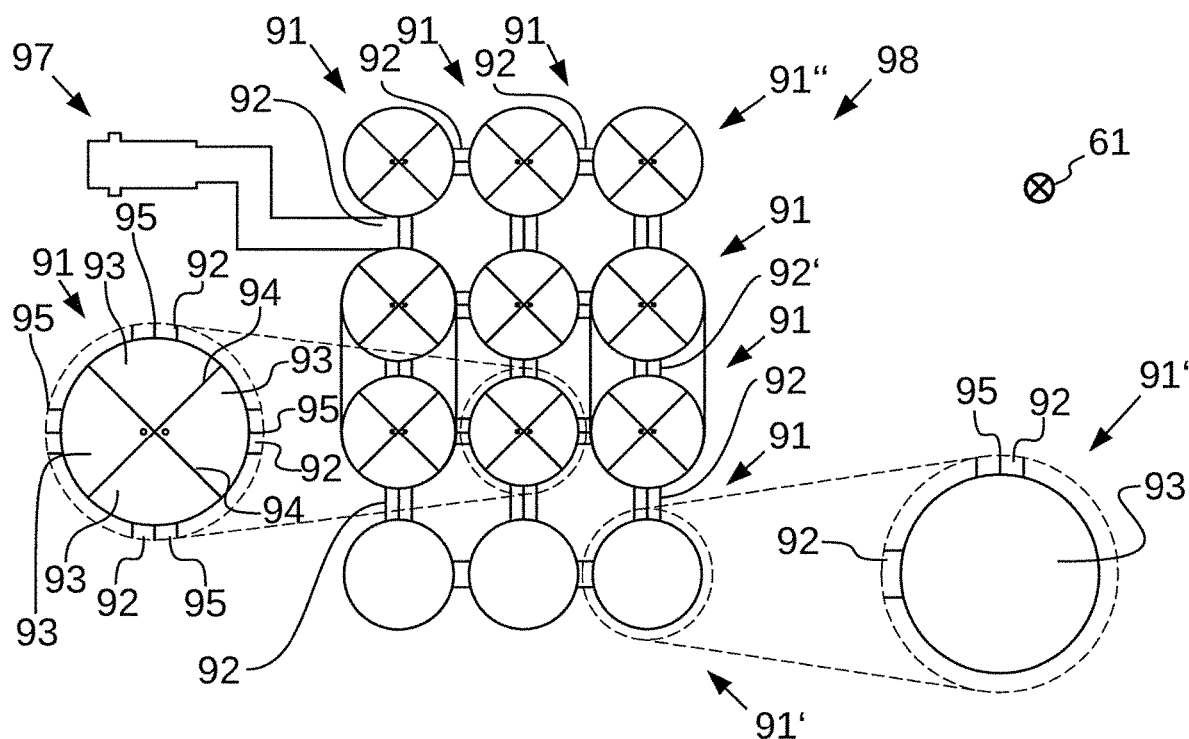
FIG. 10 shows a top plan view of a flexible printed circuit board in the remote control from FIG. 5.
Figure 11:
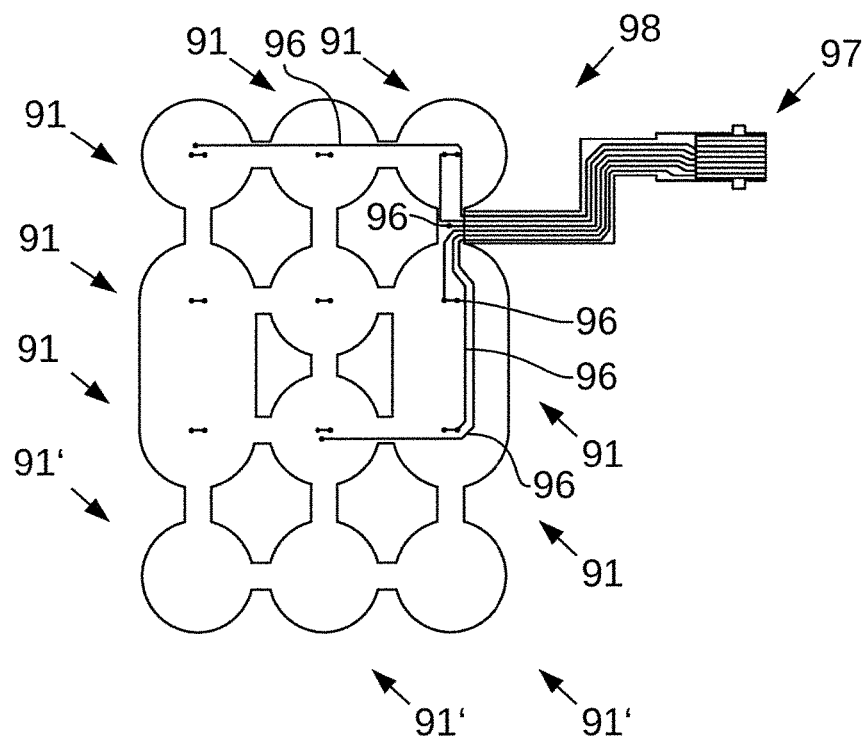
FIG. 11 shows a bottom plan view of a flexible printed circuit board in the remote control from FIG. 5.

FIGS. 10 and 11 show a flexible printed circuit board 98 from the top side as seen in the pressure direction 61 and from the underside as seen in the pressure direction 61, respectively, which is installed in the second button field 60 in the remote control 48. The flexible printed circuit board 98 of the second button field 60 is configured analogously to the flexible printed circuit board 98 of the first button field 51. The only structural, not exclusively geometrical difference is two thickened connecting bridges 92', with which even button swipes can be stabilised.

The invention claimed is:

1. A remote control comprising
    a first data read-in device and a second data read-in which are each designed to read in data in a pressure direction on the basis of a pressure exerted by a user,
    a first pressure take-up element assigned to the first data read-in device and a second pressure take-up element assigned to the second data read-in device, which elements each have a pressure take-up side for taking up the pressure applied by the user, and a pressure output side for outputting the taken up pressure to the respective data read-in device;
    a flexible printed circuit board which connects the pressure take-up sides of the pressure take-up elements to each other and on which at least one capacitive measurement transducer is formed whose capacitance is dependent on the position of a finger of the user on the flexible printed circuit board; and
    a first button element and a second button element which in each case are situated on one of the sides of the flexible printed circuit board opposite the pressure take-up sides of the pressure take-up elements;
    wherein the flexible printed circuit board is held in a form-fitting manner directly on an underside of at least one of the button elements as viewed at an angle to the pressure direction;
    a second printed circuit board comprising galvanically isolated switching contacts which are adapted to be short-circuited by electrically conductive contact domes on the second printed circuit board when the button elements are pressed, wherein the first flexible printed circuit board is positioned between the button elements and the second printed circuit board.

2. The remote control as claimed in claim 1, wherein the button elements each have a pressure take-up side for taking up the pressure applied by the user, which lie in the same plane in a pressure-free state.

3. The remote control as claimed in claim 1, wherein the two button elements each have an edge, which edges are arranged facing one another with a gap of less than 1 mm.

4. The remote control as claimed in claim 3, wherein the button elements are tapered at the respective edge along their thickness as viewed in the pressure direction.

5. The remote control as claimed in claim 1, wherein the flexible printed circuit board is adhesively bonded with the pressure take-up elements and with the button elements.

6. The remote control as claimed in claim 1, wherein the flexible printed circuit board is held in a form-fitting manner at least at one of the button elements as viewed at an angle to the pressure direction.

7. The remote control as claimed in claim 1, wherein the flexible printed circuit board has a coating in the pressure direction below a transition between the two button elements.

8. The remote control as claimed in claim 1, comprising a directional pad, wherein the two button elements are arranged around the circumference of the directional pad.

9. The remote control as claimed in claim 8, wherein the directional pad is positioned on the flexible printed circuit board.

10. The remote control as claimed in claim 1:
    wherein the button elements each have a pressure take-up side for taking up the pressure applied by the user, which lie in the same plane in a pressure-free state;
    wherein the two button elements each has an edge, which edges are arranged facing one another with a gap of less than 1 mm; and
    wherein the button elements are tapered at the respective edge along their thickness as viewed in the pressure direction.

11. The remote control as claimed in claim 1:
    wherein the button elements each have a pressure take-up side for taking up the pressure applied by the user, which lie in the same plane in a pressure-free state;
    wherein the two button elements each has an edge, which edges are arranged facing and contacting one another; and
    wherein the button elements are tapered at the respective edge along their thickness as viewed in the pressure direction.

12. The remote control as claimed in claim 1:
    wherein the flexible printed circuit board is adhesively bonded with the pressure take-up elements and with the button elements; and
    wherein the flexible printed circuit board has a coating in the pressure direction below a transition between the two button elements.

13. The remote control of claim 1 wherein the button elements are adhesively bonded with adhesive elements 33 on the flexible printed circuit board.

14. The remote control of claim 1 wherein the button elements have walls extending in the pressure direction from the button elements, which walls hold the printed circuit board in said form-fitting manner.

15. The remote control of claim 1 wherein the flexible printed circuit board is held in said form-fitting manner directly on undersides of both the first and second button elements as viewed at an angle to the pressure direction.

* * * * *